July 26, 1960 D. S. ELDERS 2,946,967

DELAY LINES

Filed Jan. 7, 1958

INVENTOR,
DANIEL ELDERS

BY

Harry M. Saragovitz
ATTORNEY.

United States Patent Office 2,946,967

Patented July 26, 1960

2,946,967

DELAY LINES

Daniel S. Elders, Englewood, N.J., assignor to the United States of America as represented by the Secretary of the Army Filed Jan. 7, 1958, Ser. No. 707,653

6 Claims. (Cl. 333—29)

(Granted under Title 35, U.S. Code (1952), sec. 266)

The invention described herein may be manufactured and used by or for the Government for governmental purposes without the payment of any royalty thereon.

This invention relates to recurrent, multisection, electrical networks and particularly to those networks of the lumped parameter, low pass filter type utilized for delay line purposes.

The increased use of lumped parameter delay lines in such critical applications as radar, scrambling, and missile guidance systems has placed emphasis upon optimum circuit performance of these devices particularly with regard to the linearity of the phase characteristics thereof. Moreover, recent trends in reduction in size of electrical systems has made it desirable to attempt to reduce the size of all components and networks including the delay lines employed. Present delay lines having linear phase characteristics generally require a relatively large volume per unit of delay, are characterized by high component costs and exhibit difficulty of fine adjustment.

It is therefore a general object of this invention to provide improved structures for recurrent, multisection electrical networks, particularly those of the delay line type.

A specific object of this invention is to provide improved structures for delay lines exhibiting linear phase characteristics.

Still more specific objects of this invention are to provide delay lines of reduced size, to reduce component costs in delay lines, and to enhance the ease of fine adjustment of delay lines.

Other objects and a fuller understanding of the invention may be had by referring to the following detailed description and the accompanying drawings, in which.

Figure 1:
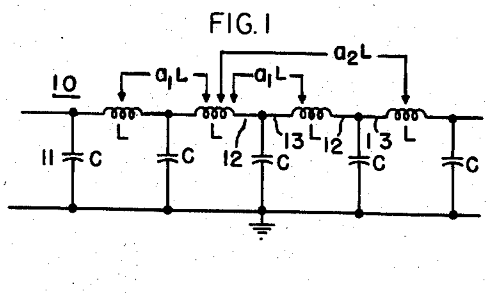
Fig. 1 is a schematic circuit representation of a lumped parameter delay line.

The schematic diagram of Fig. 1 shows a recurrent, multisection, ladder-type network consisting of a plurality of inductors 10 in series and a plurality of capacitors 11, having self inductances L and capacitances C, respectively. Each pair of adjoining ends 12 and 13 of the inductors 10 is connected to a source of reference potential, represented by ground, through a respective one of the capacitors 11. There exists between respectively adjacent, alternate, and more distant inductors, mutual inductances equal to $a_1L$, $a_2L$, $a_3L$, . . ., $a_nL$, respectively, where $a_1$, $a_2$, $a_3$, . . ., $a_n$, etc., represent the coefficients of the mutual inductances.

In order to obtain a phase shift per section of the line which is a linear function of frequency it is known that the mutual inductance $a_1L$ must be aiding or positive, $a_2L$ opposing or negative, $a_3L$ aiding or positive, etc. However, the coaxial alignment of the coils corresponding to the inductors 10 of Fig. 1 in present delay lines precludes the realization of mutual inductances therebetween of the proper signs, since if the mutual inductance between adjacent coils is made positive, as it should be, the mutual inductances between all coils will be positive. This difficulty may be avoided by utilizing auxiliary inductors or capacitors, such as those employed in delay lines of the type described and shown in Golay, Patent No. 2,598,683, issued June 3, 1952, which compensate for the actual mutual inductances between the coaxial coils thereby causing the electrical properties of the line to approach the ideal properties necessary for the realization of a perfectly linear phase characteristic. Although the above-mentioned relationship between the mutual inductances $a_1L$, $a_2L$, $a_3L$, etc., has been described with reference to the unbalanced ladder-type network of Fig. 1 it is equally applicable to a balanced ladder-type network, i.e., a lumped parameter transmission line.

The present invention permits the realization of mutual inductances of the proper sign between the inductors of a delay line solely by reason of the physical relationship between the inductors themselves. In the specific embodiment illustrated by Fig. 2, the delay line inductors 10 consist of a plurality of parallel, cylindrical cores 16 arranged in succession. The interconnection and relative winding sense of adjacent coils 14 are so related that the fluxes $\Phi$ generated by adjacent coils are in opposite directions, those of alternate coils in the same direction, etc. whereby the mutual inductances between coils are of the proper signs. For convenience in illustration the coils 14 are shown as being single-layered with adjacent coils wound in opposite sense and progressing from their respective input ends to their output ends in the same direction along their respective cores whereby the desired directional relationship between the fluxes $\Phi$ is achieved. However, it is to be understood that only the direction of the current around the core would have any real significance, and in the case of multilayer coils even the adjacent layers of each coil would progress in opposite directions along the associated core.

Figure 3:
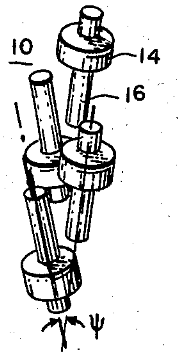
Fig. 3 is a perspective view of the inductors of a delay line as represented in schematic form by Fig. 1, illustrative of a second specific embodiment of this invention.
Figure 4:
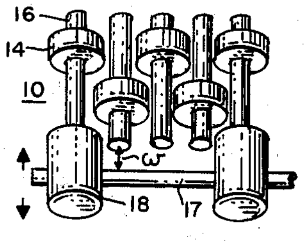
Fig. 4 is a perspective view of the relationship between the inductors of a portion of a delay line representable in schematic form by Fig. 1 and a rod of magnetic material illustrative of another specific embodiment of this invention.

Although the coils 14 of Fig. 4 are shown as being axially parallel it is quite evident that mutual inductances of the requisite signs could be obtained if the axes of the coils were canted at an angle with respect to one another. For example, the axes of alternate coils could be made parallel and the axes of adjacent coils set at an acute angle $\phi$ with each other as illustrated by Fig. 3.

In addition to the signs of the mutual inductances between inductors, the relative magnitude thereof are known to affect the phase characteristics of delay lines. In "The Ideal Low-Pass Filter in the Form of a Dispersionless Lag Line," by Marcel J. E. Golay, Proceedings of the IRE, March 1946, the circuit of Fig. 1 is analyzed to determine the conditions necessary to achieve a linear phase characteristic under the assumption that the distributed capacitance of the inductors 10 is non-existent. However, such an assumption can never be met in practice and in many applications of delay lines the distributed capacitance introduces an appreciable reactance at the high end of the pass band which in turn affects the relationship between phase shift and frequency. By considering each of the inductors 10 of Fig. 1 to be in parallel with a capacitance equal to $bC$, where $b$ is the ratio of the distributed capacitance per inductor to the capacitance C of each of the capacitors 11, and applying the methods of analysis illustrated in the aforementioned article by Golay, the conditions necessary for the realization of a perfectly linear phase characteristic for a given desired time delay may be obtained. These conditions have been found to be expressed by the coefficients of mutual inductance, $a_1$, $a_2$, $a_3$, etc., as functions of $b$ and the time delay T per section of the line as a function of $b$, L, and C. The results for several specific values of $b$ are tabulated in Table I. Only values of $a_1$ and $a_2$ are included as it has been established that the higher order coefficients of mutual inductance $a_3$, $a_4$, etc., have negligible effect on the phase characteristics. A similar table can be compiled for the heretofore mentioned balanced, ladder-type line by the same methods of analysis. With reference to Table I it may be noted that in contrast to the article by Golay, an aiding mutual inductance is here considered to be positive in sign and an opposing mutual inductance negative in sign, whereby $a_1$ is a positive quantity and $a_2$ a negative quantity.

*Table I*

| b | $a_1$ | $a_2$ | $LC/T^2$ |
|---|---|---|---|
| 0 | .167 | −.029 | .774 |
| .01 | .176 | −.027 | .762 |
| .02 | .185 | −.025 | .750 |
| .03 | .193 | −.023 | .738 |
| .04 | .201 | −.021 | .727 |
| .05 | .208 | −.018 | .717 |

While the values of $a_1$ and $a_2$ tabulated in Table I provide a practical approach to the ideal delay line having a perfectly linear phase characteristic, it is not to be understood that the application of the foregoing principles or those hereinafter presented is restricted to delay lines having the exact values given. Thus, for instance, while the values given will provide delay lines which have nearly linear phase characteristics from zero frequency to cut-off frequency, slightly different values may also be chosen to improve, for example, the degree of linearity in the lower half of the frequency band even more than is possible by utilizing the values of Table I. However, it is clear that such an improvement in the lower half of the frequency band would be somewhat at the expense of the linearity of the remaining portion of the band so that the overall degree of linearity would not be as great as that obtainable with the particular values given.

Figure 2:
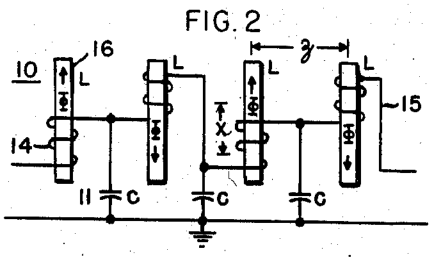
Fig. 2 is a partially schematic representation including a front view of the inductors of a delay line as represented in schematic form by Fig. 1, illustrative of one specific embodiment of this invention.
Figure 2A:
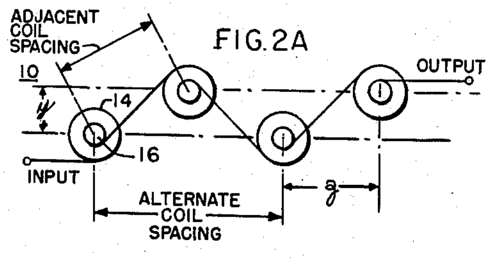
Fig. 2A is a bottom view of the inductors of Fig. 2.

In order to achieve not only mutual inductances between adjacent and alternate coils of the proper signs but also the proper magnitudes, it is a feature of this invention that there be provided between adjacent inductors a plurality of spatial dimensions the magnitudes of which determine the magnitudes of the mutual inductances. This feature is incorporated in the specific embodiment illustrated by Figs. 2 and 2A in which the cores 16 are arranged in two linear, parallel arrays with alternate cores in the same array and adjacent cores in opposite arrays as shown in Fig. 2A, the coils on adjacent cores being offset from one another in a direction transverse to the longitudinal direction of the arrays as shown in Fig. 2. Such an arrangement gives rise to the three dimensions $x$, $y$, and $z$, the magnitudes of which determine the magnitudes of the mutual inductances between adjacent and alternate coils. Although the specific embodiment referred to exhibits three spatial dimensions between adjacent coils, the proper relative magnitude of mutual inductance may be obtained in arrangements having only two of these dimensions, the third dimension being equal to zero. Moreover, by canting the axes of adjacent coils at an angle with respect to one another the magnitudes of the mutual inductances between adjacent and alternate coils may be further varied thereby providing a fourth spatial dimension adaptable to achieving the desired relationship between these inductances. For example, as heretofore mentioned, the axes of alternate coils could be made parallel and the axes of adjacent coils set at an angle with each other. Still further, the above-mentioned parallel arrays need not be linear but may have other convenient geometries. For instance, the coils could be arranged in two concentric, semicircular arrays. Should the circumferential distance between the coils comprising the inner array be so much smaller than that between the coils comprising the outer array as to create an appreciable difference between the magnitude of the mutual inductance between the adjacent coils of the inner array and the magnitude of the mutual inductance between the adjacent coils of the outer array, the coils of the outer array may be placed in the same plane and adjacent coils of the inner array placed in opposite parallel planes situated on either side of the plane containing the outer array and parallel thereto. Such an arrangement would compensate for the deviation in circumferential distance between the adjacent coils of the inner array and the adjacent coils of the outer array thereby providing the same mutual inductance between any of the alternate coils of the line.

Figure 4A:
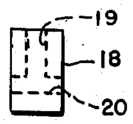
Fig. 4A is a detailed front view of an insulating cap for supporting the rod of Fig. 4.

Although from a purely theoretical viewpoint it is possible to construct a delay line in which the mutual inductances between adjacent and alternate inductors are in exact conformance with desired predetermined values for $a_1$ and $a_2$, such as those given in Table I, it must be recognized that in practice such a situation would rarely occur due to the normal constructional deviations introduced by any process of fabrication. It is a feature of this invention to correct the fabrication errors in the mutual inductances between the inductors of a delay line by altering the magnetic circuit of the line. This may be accomplished by situating one or more rods or bars of magnetic material in the near vicinity of the line which extends in the longitudinal direction thereof as illustrated by Fig. 4. Referring to Fig. 4, thin ferrite rod 17 is mounted on the cores 16 of a plurality of inductors 10 forming a portion of a delay line by means of two cylindrical insulating caps 18. Each insulating cap, as shown in detail in Fig. 4A, is hollow and is provided with a bore 20 cut diametrically through the walls thereof. Each end of the rod 17 extends through the bore 20 of a respective one of the insulating caps 18 and is rigidly attached thereto. The caps 18 are placed on corresponding ones of the cores 16 which fit snugly into the open ends 19 thereof, the caps being adjustably movable on these cores whereby the distance $w$ between the rod 17 and inductors 10 may be varied as desired. It has been found that by utilizing relatively short rods of the type depicted in Fig. 4 covering a span of approximately two adjacent inductors, the mutual inductance between adjacent inductors may be increased, the amount of increase depending upon the length $w$, without appreciably affecting the coupling between alternate inductors. On the other hand, the use of relatively long rods has been found to increase the mutual inductance between alternate inductors, the amount of increase also depending on the distance $w$, and increase or decrease the mutual inductance between adjacent inductors depending on the length of the rod.

Figure 5:
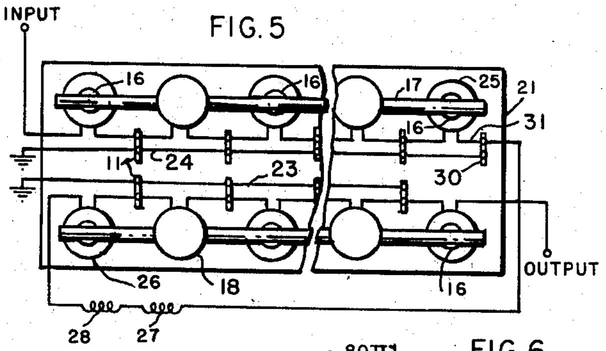
Fig. 5 is a top view of the structural features of a delay line comprising two recurrent, multisection, ladder-type networks of the low pass filter type illustrative of still another specific embodiment of this invention.
Figure 5B:
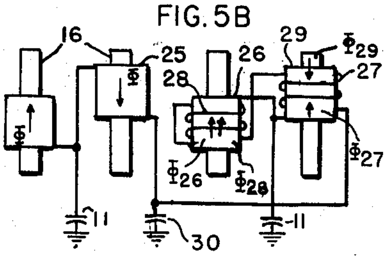
Fig. 5B is a partially schematic representation; including the electrical connection between the networks of Fig. 5.
Figure 5A:
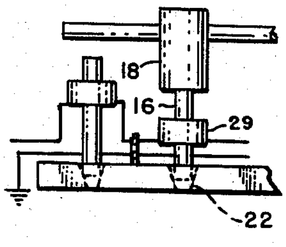
Fig. 5A is a front view of a portion of the delay line of Fig. 5.

In the specific embodiment illustrated in Figs. 5 and 5A, the delay line comprises two serially connected, recurrent, multisection networks of the type shown in Fig. 1, the networks being physically arranged in a parallel relationship whereby the overall mechanical length of the delay line is considerably reduced. Each network includes a plurality of serially connected inductors 10 arranged in succession on a flat rectangular base 21 of insulating material. The inductors 10 consist of a plurality of coils wound on a corresponding plurality of cores 16 wedged in tapered holes 22 cut into the rectangular base 21. The pairs of adjoining ends of adjacent coils in each network are connected to a source of reference potential, represented by ground, through a plurality of capacitors 11 which are directly connected in either one of two grounded wires 23 and 24 extending along the entire length of the base 21. An additional capacitor 30 having a capacitance equal to the capacitance of each of the capacitors 11 within the two networks connects the output lead 31 of the right-hand terminal coil 25 of the upper network to ground. Thin rods 17 of the type depicted in Fig. 4 are distributed along the length of each network and mounted on the inductor cores thereof by means of insulating caps 18 of the type depicted in Fig. 4A. The input and output ends of the delay line are located at opposite edges of the base 21 thus insuring maximum isolation therebetween. It would, of course, be possible to locate the input and output ends of the line at the same edge of the base 21 and still maintain maximum isolation therebetween by shielding the networks from one another or separating them by a relatively large distance.

Due to the remote position between the inter-connected terminal coils 25 and 26 of the upper and lower networks of Fig. 5, there is virtually no mutual inductance between networks. In order to compensate for this lack of mutual inductance, which would otherwise create a discontinuity in the delay line, the networks are connected together through two serially connected inter-network coupling coils 27 and 28 which are mechanically related to the left-hand terminal coil 26 and the coil 29 adjacent thereto of the lower network as shown in Fig. 5B. Referring to Fig. 5B, the coupling coil 27 connected to the right-hand terminal coil 25 of the upper network is coaxially wound over the coil 29 adjacent the left-hand terminal coil 26 of the lower network so as to establish a negative mutual inductance therebetween as indicated by the opposing directions of the flux $\Phi_{29}$ generated by coil 29 and the flux $\Phi_{27}$ generated by coil 27. The other coupling coil 28 connected to the left-hand terminal coil 26 of the lower network is coaxially wound over that coil in such manner as to create a positive mutual inductance therebetween as shown by the fluxes $\Phi_{26}$ and $\Phi_{28}$ generated by coils 26 and 28, respectively, which are in aiding relationship. It has been found that these inter-network coupling coils 27 and 28 provide the necessary compensation required for linear operation of the delay line over its pass band when the first mentioned coupling coil 27 and the other coupling coil 28 have $|a_2|N$ and $(|a_1|-|a_2|)N$ turns, respectively, where $|a_1|$ and $|a_2|$ represent the absolute values of the coefficients of mutual inductance $a_1$ and $a_2$, respectively and N is the number of turns per coil of the coils contained within the two recurrent, multisection networks.

Figure 6:
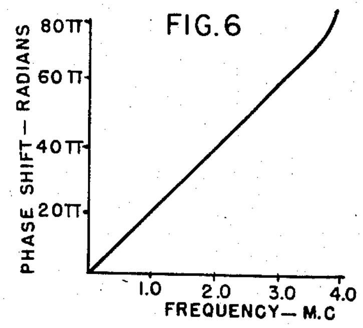
Fig. 6 is a graph of the phase shift versus frequency for a specific delay line constructed in accordance with the principles of this invention.

The phase characteristic depicted in Fig. 6 for a delay line of the type shown in Figs. 5 and 5A having a total time delay of 10 microseconds and a cut-off frequency of 4 megacycles exhibits no phase distortion for frequencies up to 90% of the cut-off frequency thereby illustrating the high degree of linearity that may be obtained by application of the principles of this invention.

It is to be understood that the above-described arrangements are illustrative of the application of the principles of the invention. Numerous other arrangements may be devised by those skilled in the art without departing from the spirit and scope of the invention. Moreover, while the invention has been described with reference to delay lines it is to be understood that the principles heretofore delineated are equally applicable to low-pass filters employed for other than delay line purposes and the heretofore mentioned balanced ladder-type line.

What is claimed is:

1. A recurrent, multisection, ladder-type delay line comprising two linear arrays of coils electrically connected in series with alternate coils of the series in the same array and adjacent coils in opposite arrays, the axes of each coil in one array of coils lying in a first plane and the axes of each coil in the other array lying in a second plane, said arrays of coils being offset from one another so that the coils are connected in zigzag fashion along the line, said coils being wound to provide positive mutual coupling between adjacent coils and negative mutual coupling between alternate coils, an input circuit for feeding a signal to one end of said line and an output circuit for passage of the signal from the other end of said line.

2. The apparatus of claim 1, wherein said first and second planes are parallel to each other.

3. The apparatus of claim 1, wherein said first and second planes intersect each other at an acute angle.

4. The apparatus of claim 1, wherein each of said coils is provided with a magnetic core and a rod of magnetic material is slidably mounted on two spaced cores, whereby the coupling coefficients of said coils may be adjusted.

5. A delay line comprising a first array of coils, the axes of which all lie in a first plane, a second array of coils, the axes of which all lie in a second plane, said arrays of coils being offset from each other along the length of said line, said coils being electrically connected in series in zigzag fashion, so that each coil is connected along the line to a coil in the opposite plane, said coils being wound to provide positive mutual coupling between adjacent coils and negative mutual coupling between alternate coils, a shunt capacitor connected from the junction of each pair of coils to a source of reference potential, and an input circuit for feeding a signal to one end of said line and an output circuit for passage of the signal from the other end of said line.

6. A delay line comprising a plurality of coils electrically connected in series arranged as two coupled arrays with adjacent coils of the series in opposite arrays and therefore alternate coils in the same array, the coils being offset and connected in zigzag relation along the arrays, the winding sense of the coils providing positive mutual coupling between adjacent coils and negative mutual coupling between alternate coils, and a plurality of shunt connected capacitors across the line, each pair of adjoining ends of said coils being connected to a respective one of said capacitors, an input circuit for feeding signals to one end of said line, and an output circuit for passage of the signal from the other end of said line.

References Cited in the file of this patent

UNITED STATES PATENTS

| | | |
|---|---|---|
| 2,569,309 | Hepp | Sept. 25, 1951 |
| 2,589,076 | Hancock et al. | Mar. 11, 1952 |
| 2,608,623 | Cutler et al. | Aug. 26, 1952 |
| 2,702,372 | Hickey | Feb. 15, 1955 |
| 2,703,389 | Schwartz | Mar. 1, 1955 |
| 2,874,358 | Abell | Feb. 17, 1959 |

FOREIGN PATENTS

| | | |
|---|---|---|
| 733,763 | Great Britain | July 20, 1955 |